(12) United States Patent
Verma et al.

(10) Patent No.: US 10,305,708 B2
(45) Date of Patent: *May 28, 2019

(54) METHODS, SYSTEMS, AND APPARATUS FOR THE IMPROVEMENT OF SIGNAL INTEGRITY OVER AN UNBALANCED DIFFERENTIAL CHANNEL

(71) Applicant: Avago Technologies International Sales Pte. Limited, Singapore (SG)

(72) Inventors: Shwetabh Verma, Los Altos, CA (US); Bhaskar Banerjee, San Jose, CA (US); Amiad Dvir, Irvine, CA (US); Assaf Naor, Tel Aviv (IL)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/041,129

(22) Filed: Jul. 20, 2018

(65) Prior Publication Data

US 2018/0331862 A1 Nov. 15, 2018

Related U.S. Application Data

(63) Continuation of application No. 15/284,359, filed on Oct. 3, 2016, now Pat. No. 10,033,556.

(60) Provisional application No. 62/383,940, filed on Sep. 6, 2016, provisional application No. 62/238,572, filed on Oct. 7, 2015.

(51) Int. Cl.
*H04L 25/03* (2006.01)
*H03K 5/24* (2006.01)
*H03K 5/01* (2006.01)
*H03H 7/06* (2006.01)
*H03K 5/00* (2006.01)

(52) U.S. Cl.
CPC ......... *H04L 25/03834* (2013.01); *H03H 7/06* (2013.01); *H03K 5/01* (2013.01); *H03K 5/24* (2013.01); *H03K 2005/00058* (2013.01)

(58) Field of Classification Search
CPC ........ H03F 1/3247; H03F 1/3294; H03F 3/45; H03H 7/06; H03K 1/02; H03K 3/01; H03K 5/01; H03K 5/24; H03K 9/003; H04B 1/04; H04B 1/10; H04B 1/40; H04B 1/62; H04B 10/04; H04L 25/03; H04L 25/14; H04L 25/49; H04L 25/03834; H04L 25/03828; H04L 25/4917; H04L 27/368
USPC ........ 327/108, 109, 170, 306, 361; 330/301; 375/219–236, 285, 296; 398/201
See application file for complete search history.

(56) References Cited

U.S. PATENT DOCUMENTS

| | | | |
|---|---|---|---|
| 6,603,416 | B2 | 8/2003 | Masenas et al. |
| 7,327,814 | B1 | 7/2008 | Xu |
| 9,553,742 | B1 | 1/2017 | Xu |
| 2006/0158258 | A1 | 7/2006 | Storino |
| 2014/0153620 | A1 | 6/2014 | Longo et al. |
| 2014/0361813 | A1 | 12/2014 | Miao et al. |
| 2017/0104615 | A1 | 4/2017 | Verma et al. |

*Primary Examiner* — Shawkat M Ali
(74) *Attorney, Agent, or Firm* — Sterne, Kessler, Goldstein & Fox P.L.L.C.

(57) ABSTRACT

Methods, systems, and apparatuses are described for improving the signal integrity of a differential pair of signals by mitigating a non-balanced channel deficiency. For example, signal integrity may be improved by independently shaping and/or independently controlling the slopes (e.g., the rising edge and/or falling edge) of each signal of a differential pair of signals to counteract the effects caused by non-balanced deficiencies to provide a balanced differential pair of signals (i.e., signals having symmetrical impedances, loads, etc.).

20 Claims, 8 Drawing Sheets

METHODS, SYSTEMS, AND APPARATUS FOR THE IMPROVEMENT OF SIGNAL INTEGRITY OVER AN UNBALANCED DIFFERENTIAL CHANNEL

CROSS-REFERENCE TO RELATED APPLICATIONS

This application is a continuation of U.S. patent application Ser. No. 15/284,359, filed Oct. 3, 2016, entitled "Methods, Systems, and Apparatus For the Improvement Signal Integrity Over an Unbalanced Differential Channel," which claims priority to U.S. Provisional Patent Application No. 62/238,572, filed Oct. 7, 2015, entitled "Improving Signal Integrity Over an Unbalanced Differential Channel," and U.S. Provisional Patent Application No. 62/383,940, filed Sep. 6, 2016, entitled "Methods, Systems, and Apparatuses for the Improvement of Signal Integrity Over an Unbalanced Differential Channel," the entireties of all of which are incorporated by reference herein.

BACKGROUND

Technical Field

The subject matter described herein relates to communication systems, and in particular, to improving signal integrity.

Background Art

For most low cost communication channel designs that include a laser driver or a SERDES (serializer/deserializer) driver, an emerging requirement is to mitigate a non-balanced channel deficiency. The basic nature of the channel in direct modulated laser systems (e.g., a passive optical network (PON) system, a pulse amplitude modulation (PAM) system, etc.) is non-balance between the positive output and the negative output of a differential signal due to the fact that a single-ended load is being driven. Furthermore, the limited number of layers available on printed circuit boards (PCBs) in low cost system-on-a-chip (SOC) solutions induces imbalance to the differential transmission lines. Degraded signal integrity due to non-balanced channel behavior in future high-speed SERDES output/inputs may be insufficiently remedied by traditional techniques of balanced compensation.

BRIEF SUMMARY

Methods, systems, and apparatuses are described for improving signal integrity, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner.

In embodiments, a driver circuit for improving signal integrity for a differential pair of signals is described herein. The driver circuit includes a signal level detector configured to detect a change in signal level for a first signal of the differential pair of signals. The driver circuit also includes pulse shaping logic configured to generate a delayed and scaled version of the first signal based on the detected change in signal level, generate a delayed and scaled version of the second signal based on the detected change in signal level, combine the first signal and the delayed and scaled version of the first signal to generate a first shaped signal, and combine the second signal and the delayed and scaled version of the second signal to generate a second shaped signal. The driver circuit further includes an edge-rate control filter configured to adjust at least one of a rise time or a fall time of the first shaped signal to generate a first adjusted signal and adjust at least one of a rise time or a fall time of the second shaped signal to generate a second adjusted signal. The first adjusted signal and the second adjusted signal are a balanced differential pair of signals.

A method implemented by a driver circuit for improving signal integrity for a differential pair of signals is also described herein. In accordance with the method, a change in signal level for a first signal of the differential pair of signals is detected. A scaled version of the first signal is generated based on the detected change in signal level. A scaled version of the second signal is generated based on the detected change in signal level. A delayed and scaled version of the first signal is generated based on the detected change in signal level. A delayed and scaled version of the second signal is generated based on the detected change in signal level. The scaled version of the first signal and the delayed and scaled version of the first signal are combined. The scaled version of the second signal and the delayed and scaled version of the second signal are combined. At least one of a rise time or a fall time of the first shaped signal is adjusted to generate a first adjusted signal. At least one of a rise time or a fall time of the second shaped signal is adjusted to generate a second adjusted signal. The first adjusted signal and the second adjusted signal are a balanced differential pair of signals.

Another driver circuit for improving signal integrity for a differential pair of signals is described herein. The driver circuit includes a signal level detector configured to detect a change in signal level for a first signal of the differential pair of signals. The driver circuit also includes pulse shaping logic configured to independently control the manner in which a first signal of the differential pair of signals is shaped and the manner in which a second signal of the differential pair of signals is shaped based on the detected change in signal level.

These and further example embodiments are described in detail in the following sections (and subsections, where applicable).

Example Embodiments

Techniques described herein improve the signal integrity of a differential pair of signals by mitigating a non-balanced channel deficiency. For example, signal integrity may be improved by independently shaping and/or independently controlling the slopes (e.g., the rising edge and/or falling edge) of each signal of a differential pair of signals to counteract the effects caused by non-balanced deficiencies to provide a balanced differential pair of signals (i.e., signals having symmetrical impedances, loads, etc.).

Figure 1:
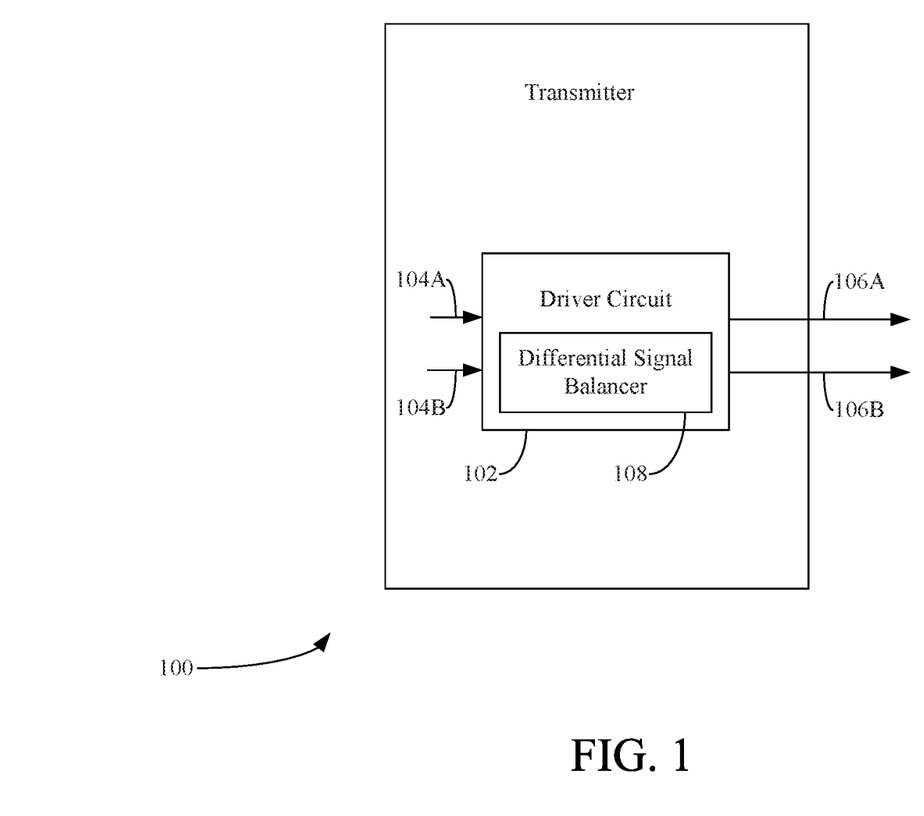
FIG. 1 depicts a block diagram of a transmitter including a driver circuit implementing a differential signal balancer in accordance with an embodiment.

FIG. 1 depicts a block diagram of a transmitter 100 including a driver circuit 102 in accordance with an embodiment. Transmitter 100 may be a high-speed data transmitter configured to transmit data to another device at multiple gigabits-per second. Such data may be transmitted by transmitter 100 modulated on a carrier signal having a multiple gigahertz frequency. For example, as shown in FIG. 1, transmitter 100 may be configured to transmit data received via incoming differential signals, which comprise a first signal 104A and a second signal 104B. First signal 104A may have a first signal level, and second signal 104B may have a second signal level that is opposite to the first signal level. That is, first signal 104A is a complement of (i.e., is 180 degrees out of phase to) second signal 104B. The data may be transmitted to another device via outgoing differential signals, which comprise a third signal 106A and a fourth signal 106B. Third signal 106A may have a first signal level, and fourth signal 106B may have a second signal level that is opposite to the first signal level. That is, third signal 106A is a complement of fourth signal 106B. Driver circuit 102 may be configured to control (e.g., regulate, amplify or limit) the current of one or more of the incoming differential signals (i.e., first signal 104A and second signal 104B) before providing data via the outgoing differential signals (i.e., third signal 106A and fourth signal 106B) to another device. Examples of driver circuit 102 include a PON-based driver circuit, a PAM-based driver circuit, high-speed SERDES driver and/or the like.

First signal 104A and second signal 104B may suffer from a non-balanced deficiency, where the impedances, the load, etc. are asymmetric between incoming first signal 104A and second signal 104B. For example, asymmetric channel parasitics (due to variances in bond wires, bond-pads, PCB traces etc., used to provide first signal 104A and second signal 104B) may cause an overshoot and/or undershoot of current on a rising edge and/or falling edge of at least one first signal 104A and second signal 104B. In an embodiment in which driver circuit 102 is a laser driver, driver circuit 102 may drive a single-ended load, such as a laser diode, thereby causing an asymmetrical load between first signal 104A and second signal 104B. Such non-balanced deficiencies can severely distort first signal 104A and second signal 104B and/or increase jitter.

Driver circuit 102 may be configured to mitigate these non-balanced deficiencies. For example, as shown in FIG. 1, driver circuit 102 includes a differential signal balancer 108. Differential signal balancer 108 is configured to independently shape (e.g., pre-distort) at least one of first signal 104A and second signal 104B to counteract the effects caused by non-balanced deficiencies to provide a balanced third signal 106A and fourth signal 106B (i.e., signals having symmetrical impedances, loads, etc.). For example, as will be described below, differential signal balancer 108 may independently shape first signal 104A by combining a scaled version of first signal 104A with a delayed and scaled version of first signal 104A to generate a first shaped signal. Similarly, differential signal balancer 108 may independently shape second signal 104B by combining a scaled version of second signal 104B with a delayed and scaled version of second signal 104B to generate a second shaped signal. The amount of delaying and/or scaling performed on at least one of first signal 104A may differ from the amount of delayed and/or scaling performed second signal 104B. Differential signal balancer 108 may also independently control the slope (e.g., the rising edge and/or falling edge) of at least one of the first shaped signal and the second shaped signal to adjust at least one of a rise time or a fall time of the first shaped signal and/or the second shaped signal. The resulting adjusted signals are a balanced differential pair of signals (i.e., third signal 106A and fourth signal 106B).

Figure 2:
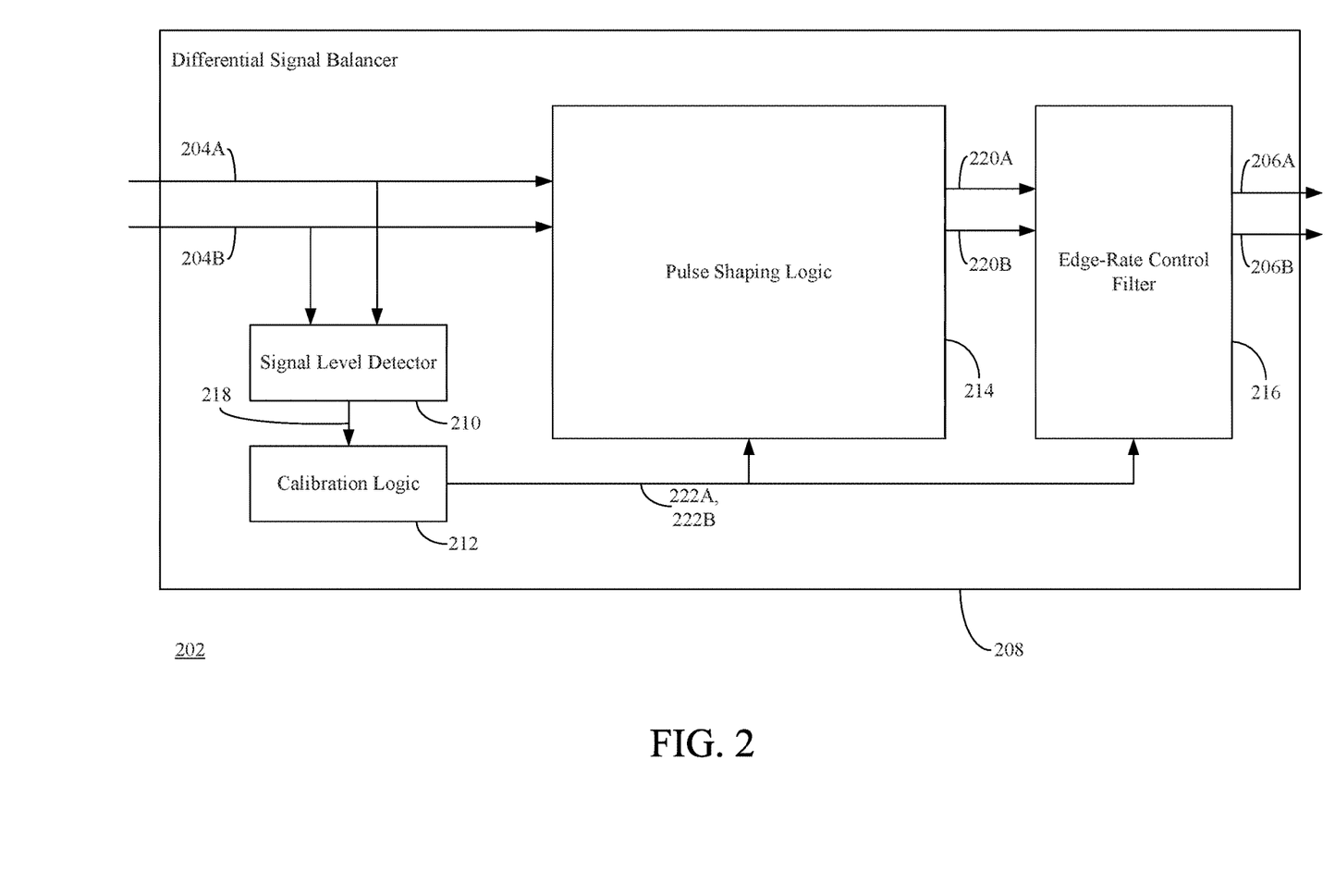
FIG. 2 depicts a block diagram of a driver circuit including a differential signal balancer in accordance with an embodiment.

FIG. 2 depicts a block diagram of a driver circuit 202 including a differential signal balancer 208 in accordance with an embodiment. Driver circuit 202 and differential signal balancer 208 may be examples of driver circuit 102 and differential signal balancer 108 shown in FIG. 1. As shown in FIG. 2, differential signal balancer 208 includes a signal level detector 210, calibration logic 212, pulse shaping logic 214, and an edge-rate control filter 216.

Driver circuit 202 is configured to receive differential signals (e.g. first signal 204A and a second signal 204B). First signal 204A and second signal 204B may be examples of first signal 104A and second signal 104B, as shown in FIG. 1. Driver circuit 202 is configured to mitigate non-balanced deficiencies present in first signal 204A and second signal 204B to generate a balanced differential pair of signals (i.e., third signal 206A and 206B). Third signal 206A and fourth signal 206B are examples of third signal 106A and fourth signal 106B shown in FIG. 1.

Signal level detector 210 is configured to detect the signal level (e.g., a '1' (logical high signal value), '0' (logical low signal value), or one or more values therebetween) of first signal 104A and second signal 104B and generate one or more signals 218 that indicate whether the next edge of first signal 204A and second signal 204B is going to be a rising edge or a falling edge. For example, if the detected signal level of first signal 204A is a '1', signal level detector 210 may generate a first signal that indicates that the next edge of first signal 204A is a falling edge. Conversely, if the detected signal level of first signal 204A is a '0', signal level detector 210 may generate a second signal that indicates that the next edge of first signal 204B is a rising edge. If the detected signal level of second signal 204B is a '1', signal level detector 210 may generate a third signal that indicates that the next edge of second signal 204B is a falling edge. Conversely, if the detected signal level of second signal 204B is a '0', signal level detector 210 may generate a fourth signal that indicates that the next edge of second signal 204B is a rising edge. In accordance with an embodiment, signal level detector 210 may only detect the signal level of first signal 204A and infer the signal level of second signal 204B based on the detected signal level of first signal 204A. Because first signal 204A and second signal 204B are 180 degrees out of phase, the signal levels of first signal 204A and second signal 204B are complimentary. Thus, if the detected signal level of first signal 204A is a '1', then the inferred signal level of second signal 204B is a '0', and if the detected signal level is a '0', then the inferred signal level of second signal 204B is a '1. In accordance with another embodiment, signal level detector 210 may only detect the signal level of second signal 204B and infer the signal level of first signal 204A. Signal level detector 210 may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above. It is noted that the values detected by signal level detector 210 described above are purely exemplary and that signal level detector 210 may be configured to determine whether the next edge of first signal 204 and/or second signal 204B is a falling edge or a rising edge based on any detected value.

Calibration logic 212 is configured to calibrate (e.g., program) pulse shaping logic 214 and/or edge-rate control filter 216 based on signal(s) 218 generated by signal level detector 210. For example, calibration logic 212 may set one or more first parameters 222A (such as one or more predetermined delays and/or one or more predetermined weighted gains) that are received and used by pulse shaping logic 214 to generate a shaped version of first signal (e.g., first shaped signal 220A) and/or a shaped version of second signal (e.g., second shaped signal 220B). Calibration logic 212 may also set one or more second parameter(s) 222B (such as one or more resistance values and/or one or more capacitance values) that are to be used by edge-rate control filter 216 to adjust the rise time and/or fall time of first shaped signal 220A and/or second shaped signal 220B.

The values of the first parameter(s) 222A and the second parameter(s) 222B that are set may depend on signal(s) 218 provided by signal level detector 210. For example, if signal(s) 218 indicate that the next edge of first signal 204A is a rising edge (and the next edge of second signal 204B is a falling edge), calibration logic 212 may be configured to set the first parameter(s) 222A and/or second parameter(s) 222B to one or more respective first values. If signal(s) 218 indicate that the next edge of first signal 204A is a falling edge (and the next edge of second signal 204B is a rising edge), calibration logic 212 may be configured to set the first parameter(s) 222A and/or second parameter(s) 222B to one or more respective second values that may or may not be different than the first value(s).

Calibration logic 212 may comprise a memory (e.g., a look-up table) that stores the first values and the second values for first parameter(s) 222A and second parameter(s) 222B. The first values of first parameter(s) 222A and second parameter(s) 222B may be retrieved from the memory in response to calibration logic 212 receiving signal(s) that indicate that the next edge of first signal 204A is a rising edge (and the next edge of second signal 204B is a falling edge). The second values of first parameter(s) 222A and second parameter(s) 222B may be retrieved from the memory in response to calibration logic 212 receiving signal(s) that indicate that the next edge of first signal 204A is a falling edge (and the next edge of second signal 204B is a rising edge). Calibration logic 212 may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

Pulse shaping logic 214 is configured to independently shape a rising edge and/or falling edge of first signal 204A and/or a rising edge and/or falling edge of second signal 204B in accordance with the first parameter(s) 222A set by calibration logic 212 to generate first shaped signal 220A and/or second shaped signal 220B. For example, pulse shaping logic 214 may shape first signal 204A by combining a scaled version of first signal 204A with a delayed and scaled version of first signal 204A to generate first shaped signal 204A. The scaled version of first signal 204A may be generated in accordance with certain parameters of first parameters 222A (e.g., a first predetermined weighted gain). The delayed and scaled version of first signal 204A may be generated in accordance with other certain parameters of first parameter(s) 222B (e.g., a second predetermined weighted gain and a first predetermined delay). Pulse shaping logic 214 may shape second signal 204B by combining a scaled version of second signal 204B with a delayed and scaled version of second signal 204B to generate second shaped signal 220B. The scaled version of second signal 204B may be generated in accordance with certain parameters of first parameters 222A (e.g., a third predetermined weighted gain). The delayed and scaled version of second signal 204B may be generated in accordance with other certain parameters of first parameter(s) 222A (e.g., a fourth predetermined weighted gain and a second predetermined delay).

The values of the first parameter(s) 222A used to shape first signal 204A may differ from the values used to shape second signal 204B. Furthermore, the values of the first parameter(s) 222A used when shaping a rising edge of first signal 204A may be different than the values used when shaping a falling edge of first signal 204A, and the values of the first parameter(s) 222A used when shaping a rising edge of second signal 204B may be different than the values used when shaping a falling edge of second signal 240B. This advantageously enables pulse shaping logic 214 to independently shape and fine tune the falling and rising edges of each first signal 204A and second signal 204B differently (e.g., in the event that each of first signal 204A and second signal 204B suffer from different (i.e., asymmetric) channel parasitics).

Edge-rate control filter 216 is configured to independently control the slope (e.g., the rising edge and/or falling edge) of at least one of first shaped signal 220A and second shaped signal 220B to adjust at least one of a rise time or a fall time of first shaped signal 220A and second shaped signal 220B in accordance with the second parameter(s) 222B set by calibration logic 212. The resulting adjusted signals are a balanced differential pair of signals (i.e., third signal 206A and fourth signal 206B). In accordance with an embodiment, edge-rate control filter 216 may comprise one or more variable capacitors and/or one or more variable resistors that are configured to control the slope of at least one of first shaped signal 220A and second shaped signal 220B. The capacitance values of variable capacitor(s) may be defined by certain parameters of second parameter(s) 222B (e.g., predetermined capacitance values set by calibration logic 210), and the resistance values of the variable resistor(s) may be defined by other certain parameters of second parameter(s) 222B (e.g., predetermined resistance values set by calibration logic 210).

The predetermined resistance and/or predetermined capacitance value(s) used to control the slopes of first shaped signal 220A may be different than the predetermined resistance and/or predetermined capacitance value(s) used to control the slopes of second shaped signal 220B. Furthermore, the predetermined resistance and/or predetermined capacitance value(s) of the second parameter(s) used to control a rising edge of first shaped signal 220A may differ from the predetermined resistance and/or predetermined capacitance value(s) used to control a falling edge of first shaped signal 220A, and the values of the second parameter(s) 222B used to control a rising edge of second shaped signal 220B may differ from the predetermined resistance and/or predetermined capacitance value(s) used to control a falling edge of second shaped signal 220B. This advantageously enables edge-rate control filter 216 to independently control the slopes of first shaped signal 220A and second shaped signal 220B differently (e.g., in the event that each of first signal 204A and second signal 204B suffer from different (i.e., asymmetric) channel parasitics).

Figure 3:
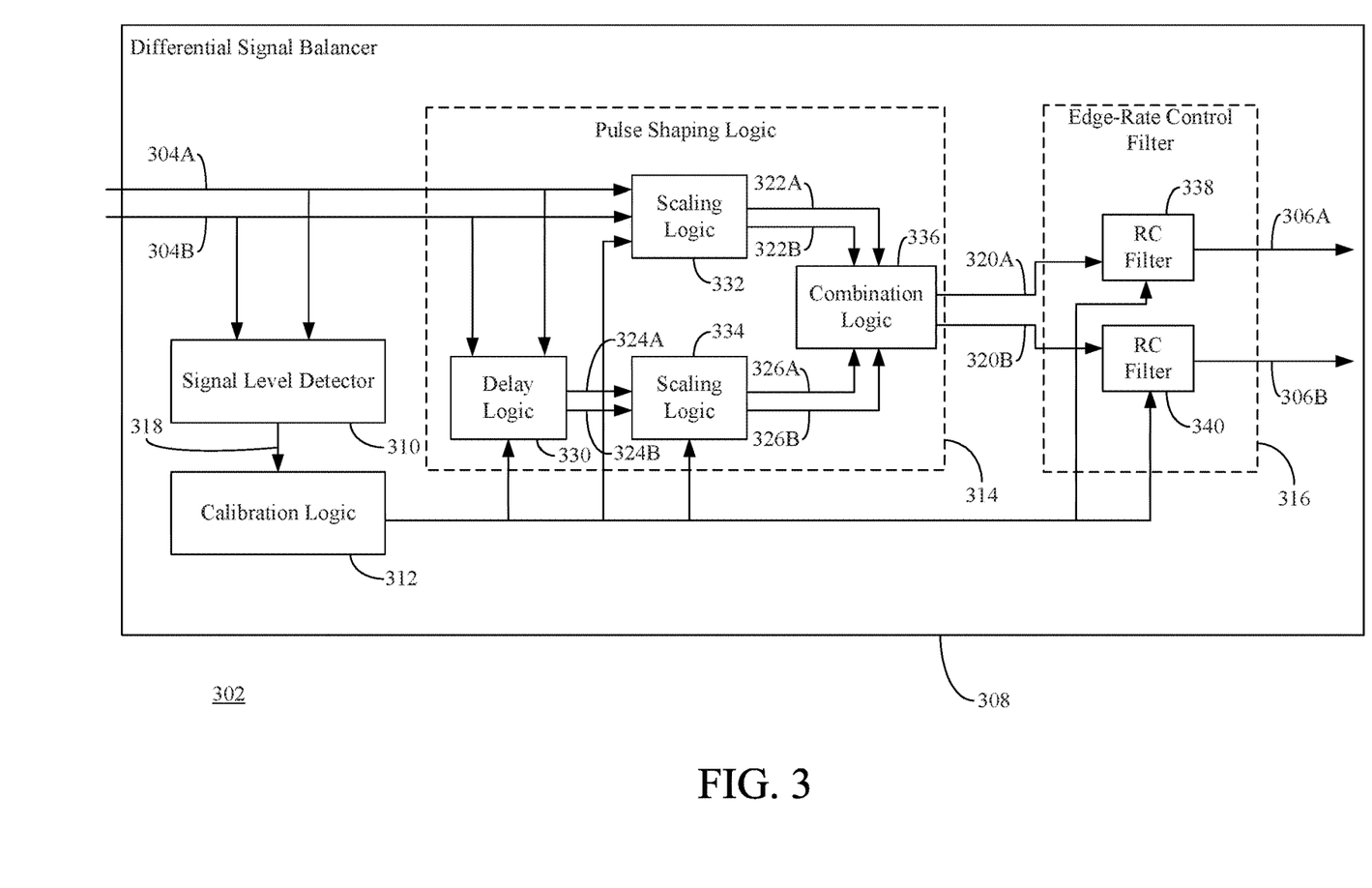
FIG. 3 depicts a block diagram of a driver circuit including a differential signal balancer in accordance with another embodiment.

FIG. 3 depicts a block diagram of a driver circuit 302 including a differential signal balancer 308 in accordance with another embodiment. Driver circuit 302 and differential signal balancer 308 are an example of driver circuit 202 and differential signal balancer 208 shown in FIG. 2. As shown in FIG. 3, differential signal balancer 308 includes a signal level detector 310, calibration logic 312, pulse shaping logic 314, and an edge-rate control filter 316. Signal level detector 310, calibration logic 312, pulse shaping logic 314, and edge-rate control filter 316 are examples of signal level detector 210, calibration logic 212, pulse shaping logic 214, and edge-rate control filter 216 shown in FIG. 2.

Driver circuit 302 is configured to receive differential signals (e.g. first signal 304A and a second signal 304B). First signal 304A and second signal 304B may be examples of first signal 204A and second signal 204B, as shown in FIG. 2. Driver circuit 302 is configured to mitigate non-balanced deficiencies present in first signal 304A and second signal 304B to generate a balanced differential pair of signals (i.e., third signal 306A and 306B). Third signal 306A and fourth signal 306B may be examples of third signal 206A and fourth signal 206B, as shown in FIG. 2.

Signal level detector 310 generates signal(s) (e.g., signal(s) 318) that indicate whether the next edge of first signal 304A and second signal 304B is going to be a rising edge or a falling edge in a similar manner as described above with reference to signal level detector 210 of FIG. 2.

Calibration logic 312 calibrates pulse shaping logic 314 and/or edge-rate control filter 316 based on signal(s) 318 in a similar manner as described above with reference to calibration logic 216 of FIG. 2. For example, calibration logic 312 may set one or more first parameters (such as one or more predetermined delays and/or one or more predetermined weighted gains) that are to be used by pulse shaping logic 314 to output a shaped version of first signal (first shaped signal 220A) and/or a shaped version of second signal (second shaped signal 320B). Calibration logic 312 may also set one or more second parameter(s) (such as one or more predetermined resistance values and/or one or more predetermined capacitance values) that are to be used by edge-rate control filter 316 to adjust the rise time and/or fall time of first shaped signal 320A and/or second shaped signal 320B.

Pulse shaping logic 314 comprises delay logic 330, first scaling logic 332, second scaling logic 334 and combination logic 336. First scaling logic 332 may be configured to generate a scaled version of first signal 304A (e.g., signal 322A) and/or a scaled version of second signal 304B (e.g., signal 322B) in accordance with certain first parameter(s) provided by calibration logic 312. For example, the first parameter(s) may include a first predetermined weighted gain that first scaling logic 332 uses to scale (e.g., apply pre-emphasis or de-emphasis to modify the amplitude of) first signal 304A (e.g., by an N number of amperes, microamperes, etc., where N is any real number) and a second predetermined weighted gain that first scaling logic 332 uses to scale second signal 304B (e.g., by an M number of amperes, microamperes, etc., where M is any real number that may are may not be the same as N). In accordance with an embodiment, first signal 304A and/or second signal 304B may be scaled by a factor of 1-K, where K is any real number that is greater than or equal to 0 and less than or equal to 1. It is noted that the K value used to scale first signal 304A may be different than the K value used to scale second signal 304B. It is further noted if a K value of 0 is used for a particular signal (e.g., first signal 304A or second signal 304B), no scaling is performed for that signal and that signal is simply passed thorough first scaling logic 332. It is also noted that the techniques for scaling first signal 304A and/or second signal 304B described above are purely exemplary and that first scaling logic 332 may be configured to scale first signal 304A and/or second signal 304B using other techniques. For example, first scaling logic 332 may be configured to functionally scale first signal 304A and/or second signal 304B such that the resulting signal(s) (e.g., signal 322A and/or signal 332B) have any shape (e.g., a symmetrical shape, asymmetrical shape, etc.) and/or amplitude. In accordance with an embodiment, first scaling logic 332 may comprise an amplifier circuit that generates signal 322A and/or signal 322B in accordance with certain first parameter(s) provided by calibration logic 312. The amplifier circuit may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

Delay logic 330 may be configured to generate a delayed version of first signal 304A (e.g., first delayed signal 324A) and/or a delayed version of second signal 304B (e.g., second delayed signal 324B) in accordance with certain first parameter(s) provided by calibration logic 312. For example, first parameter(s) may include a first delay value (e.g., N nanoseconds, picoseconds, etc., where N is any positive real number) that indicates how long delay logic 330 is to delay first signal 304A and/or a second delay value (e.g., N nanoseconds, picoseconds, etc.) that indicates how long delay logic 330 is to delay second signal 304B. Delay logic 330 may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

Second scaling logic 334 may be configured to generate a scaled version of first delayed signal 324A (e.g., first delayed and scaled signal 326A) and/or or a scaled version of second delayed signal 324B (e.g., second delayed and scaled signal 326B) in accordance with certain first parameter(s) provided by calibration logic 312. For example, first parameter(s) may include a third predetermined weighted gain that second scaling logic 334 uses to scale (e.g., apply pre-emphasis or de-emphasis to modify the amplitude of) first delayed signal 324A (e.g., by an O number of amperes, microamperes, etc., where O is any real number that may or may not be the same as M or N) and a fourth predetermined weighted gain that second scaling logic 334 uses to scale second delayed signal 326B (e.g., by a P number of amperes, microamperes, etc., where P is any real number that may or may not be the same as M, N, or P). In accordance with an embodiment, first delayed signal 324A and/or second delayed signal 324B may be scaled by a factor of K, where K is any real number that is greater than or equal to 0 and less than or equal to 1. It is noted that the K value used to scale first delayed signal 324A may be different than the K value used to scale second delayed signal 324B. It is further noted if a K value of 1 is used for a particular delayed signal (e.g., first delayed signal 324A or second delayed signal 324B), no scaling is performed for that delayed signal and that delayed signal is simply passed thorough second scaling logic 334. It is also noted that the techniques for scaling first delayed signal 324A and/or second delayed signal 324B described above are purely exemplary and that second scaling logic 334 may be configured to scale first delayed signal 324A and/or second delayed signal 324B using other techniques. For example, second scaling logic 334 may be configured to functionally scale first delayed signal 324A and/or second delayed signal 324B such that the resulting signal(s) (e.g., first delayed and scaled signal 326A and/or second delayed and scaled signal 326B) have any shape (e.g., a symmetrical shape, asymmetrical shape, etc.) and/or amplitude. In accordance with an embodiment, second scaling logic 334 may comprise an amplifier circuit that generates first delayed and scaled signal 326A and/or second delayed and scaled signal 3226 in accordance with certain first parameter(s) provided by calibration logic 312. The amplifier circuit may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

Combination logic 336 may be configured to combine (e.g., sum) first scaled signal 322A and first delayed and scaled signal 326A) to generate first shaped signal 320A and may be configured to combine second scaled signal 322B and second delayed and scaled signal 326B) to generate second shaped signal 320A. Combination logic 336 may be implemented using a combination of one or more of a processor (e.g., processor 800, as described with reference to FIG. 8), program code, a circuit comprising one or more passive components (e.g., resistors, capacitors, etc.) and/or active components (e.g., diodes, transistors, analog and/or digital integrated circuits, etc.) that are arranged to cooperatively perform the functions described above.

Edge-rate control filter 316 comprises a first resistor-capacitor (RC) filter 338 and a second RC filter 340, each comprising one or more variable resistors and/or one or more variable capacitors. First RC filter 338 may be configured to generate first adjusted signal 306A by adjusting at least one of a rise time or a fall time of first shaped signal 320A in accordance with certain second parameter(s) provided by calibration logic 312. For example, second parameter(s) may include one or more first predetermined resistance values and one or more first predetermined capacitance values. First RC filter 338 configures its variable resistor(s) and/or variable capacitance(s) to operate in accordance with the first predetermined resistance value(s) and the first predetermined capacitance value(s) to generate first adjusted signal 306A.

Second RC filter 340 may be configured to generate second adjusted signal 306B by adjusting at least one of a rise time or a fall time of second shaped signal 320B in accordance with certain second parameter(s) provided by calibration logic 312. For example, second parameter(s) may include one or more second predetermined resistance values and one or more second predetermined capacitance values. Second RC filter 340 configures its variable resistor(s) and/or variable capacitance(s) to operate in accordance with the second predetermined resistance value(s) and the second predetermined capacitance value(s) to generate second adjusted signal 306B. First adjusted signal 306A and second adjusted signal 306B are a balanced differential pair of signals (i.e., signals having symmetrical impedances, loads, etc.).

The values for the predetermined delays and weighted gains described above may be dependent on the severity and/or type of the imbalance(s) that are being mitigated. For example, the K value may be set to a relatively larger value if the type of imbalance is a relatively large overshoot or undershoot, and the K value be set to a relatively smaller value if the type of imbalance is a relatively small overshoot or undershoot. In another example the delay value(s) may be set to a relatively larger value if the overshoot or undershoot is relatively wider, and the delay value(s) may be set to a relatively smaller value if the overshoot or undershoot is relatively narrower.

Furthermore, the value for the predetermined delays and weighted gains described above may be determined during a testing and/or debug process performed for driver circuit 302. For example, after driver circuit 302 and one or more other components coupled thereto are placed on a substrate (e.g., a printed circuit board), first signal 304A and second signal 304B may be monitored to determine the severity and/or types of asymmetrical imbalances present thereon. Based on the observed imbalances, calibration logic 312 may be programmed to set rising-edge specific first parameters and/or second parameters for first signal 304A, falling-edge specific first parameters and/or second parameters for first signal 304A, rising-edge specific first parameters and/or second parameters for second signal 304B, and/or falling-edge specific first parameters and/or second parameters for second signal 304B accordingly.

Figure 4:
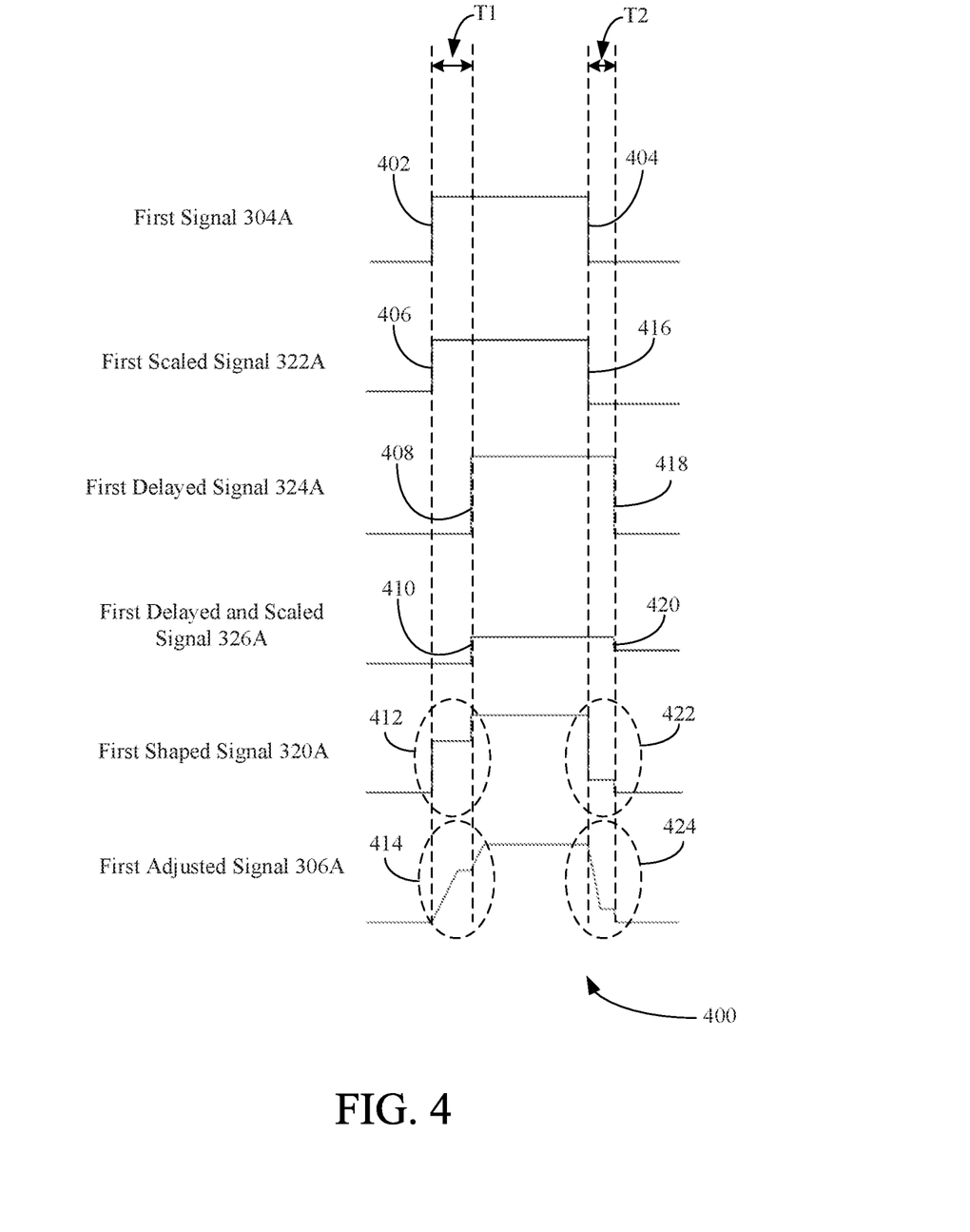
FIG. 4 depicts example waveforms illustrating how a signal is shaped and adjusted by pulse shaping logic and an edge-rate control filter, respectively, in accordance with an embodiment.

FIG. 4 depicts example waveforms 400 illustrating how a signal (e.g., first signal 304A) is shaped and adjusted by pulse shaping logic 314 and an edge-rate control filter 316, respectively, in accordance with an embodiment. Waveforms 400 will now be described with continued reference to differential signal balancer 308 of FIG. 3.

As shown in FIG. 4, first signal 304A comprises a rising edge 402 and a falling edge 404. When first signal 304A has a signal level of '0', signal level detector 310 determines that the next edge of first signal 304A will be a rising edge (i.e., rising edge 402) and generates signal(s) 318 that indicate that the next edge for first signal 304A is going to be a rising edge. In response, calibration logic 312 sets each of a first predetermined weighted gain to be used by first scaling logic 332, a first delay to be used by delay logic 330, a second predetermined weighted gain to be used by second scaling logic 334, and predetermined resistance value(s) and/or predetermined capacitance value(s) to be used by first RC filter 338 to respective first values.

Thereafter, first scaling logic 332 scales the rising edge of first signal 304A in accordance with the first predetermined weighted gain (e.g., a gain of 1−K), delay logic 330 delays the rising edge of first signal 304A in accordance with the first predetermined delay, and second scaling logic 334 scales the rising edge of first delayed signal 324A with the second predetermined weighted gain (e.g., a gain of K). As shown in FIG. 4, the rising edge of first scaled signal 322A (rising edge 406) is scaled such that its amplitude is less than the amplitude for rising edge 402 of first signal 304A. As also shown in FIG. 4, rising edge 408 of first delayed signal 324 is delayed in accordance with the first delay (by a time T1) with respect to rising edge 402 of first signal 304A. As further shown in FIG. 4, the rising edge of first delayed and scaled signal (i.e., rising edge 410) is scaled such that its amplitude is less than rising edge 402 of first signal 304A and rising edge 406 of first scaled signal 322A.

Rising edge 412 represents the combination of rising edge 406 of first scaled signal 322A and rising edge 410 of first delayed and scaled signal 326A. First RC filter 338 slows the rise time of rising edge 412 in accordance with the predetermined resistance value(s) and/or predetermined capacitance value(s) set by calibration logic 312. For example, as shown in FIG. 4, rising edge 414 of first adjusted signal 306A has a slower rise time than rising edge 412 of first shaped signal 320A.

When first signal 304A has a signal level of '1', signal level detector 310 determines that the next edge of first signal 304A will be a falling edge (i.e., falling edge 404) and generates signal(s) 318 that indicate that the next edge for first signal 304A is going to be a falling edge. In response, calibration logic 312 sets first predetermined weighted gain to be used by first scaling logic 332, the first delay to be used by delay logic 330, the second predetermined weighted gain to be used by second scaling logic 334, and predetermined resistance value(s) and/or predetermined capacitance value(s) to be used by first RC filter 338 to respective second values.

Thereafter, first scaling logic 332 scales the falling edge of first signal 304A in accordance with the newly-set first predetermined weighted gain, delay logic 330 delays the falling edge of first signal 304A in accordance with the newly-set first predetermined delay, and second scaling logic 334 scales the falling edge of first delayed signal 324A with the newly-set second predetermined weighted gain. As shown in FIG. 4, the falling edge of first scaled signal 322A (i.e., falling edge 416) is scaled such that its amplitude is greater than its rising edge 406. As also shown in FIG. 4, falling edge 418 of first delayed signal 324A is delayed in accordance with the newly-set first delay (by a time T2) with respect to falling edge 404 of first signal 304A. As further shown in FIG. 4, the falling edge of first delayed and scaled signal (i.e., falling edge 420) is scaled such that its amplitude is less than its rising edge 410.

Falling edge 422 represents the combination of falling edge 416 of first scaled signal 322A and falling edge 420 of first delayed and scaled signal 326A. First RC filter 338 slows the fall time of falling edge 422 in accordance with the newly-set resistance value(s) and/or capacitance value(s) set by calibration logic 312. For example, as shown in FIG. 4, falling edge 424 of first adjusted signal 306A has a slower fall time than falling edge 422 of first shaped signal 320A.

Figure 5:
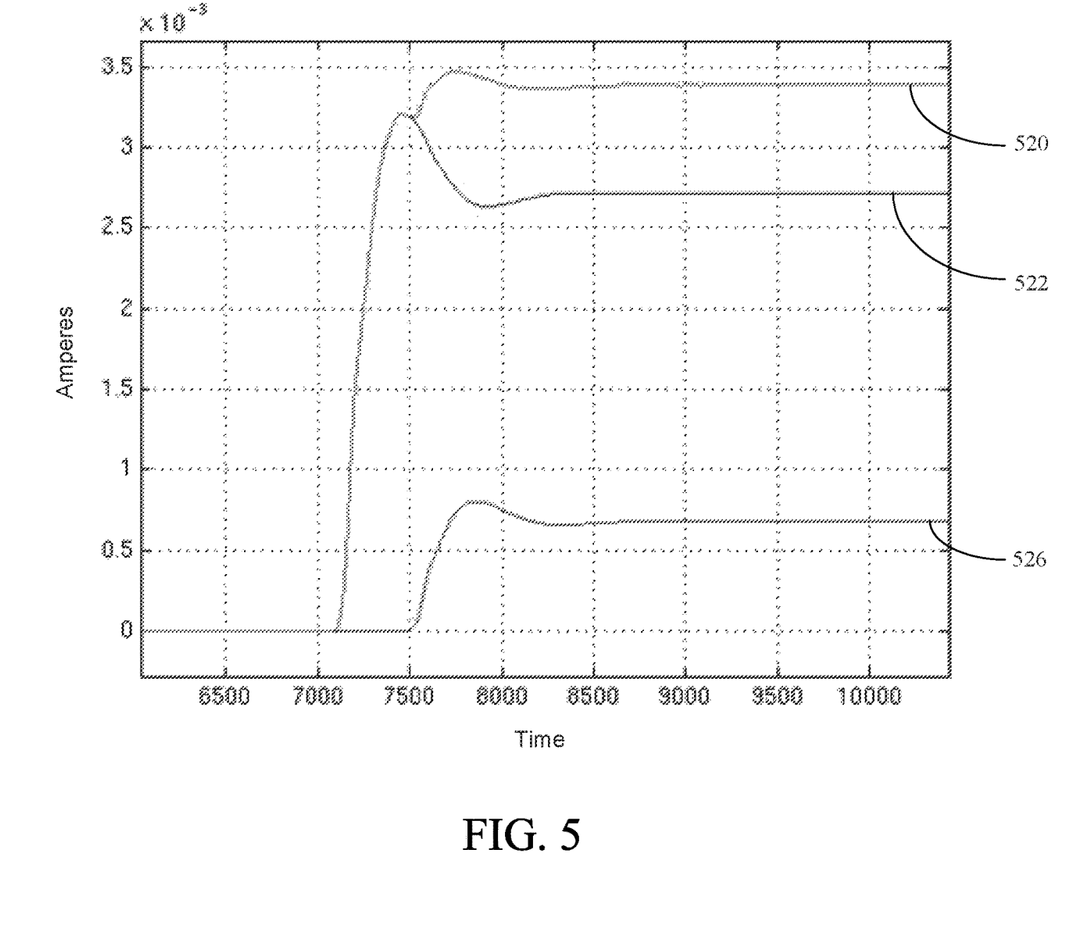
FIG. 5 depicts example waveforms illustrating a signal that has been shaped to mitigate an overshoot in a rising edge of the signal in accordance with an embodiment.

FIG. 5 depicts example waveforms 500 illustrating a signal that has been shaped to mitigate an overshoot in a rising edge of the signal in accordance with an embodiment. FIG. 5 depicts a scaled signal 522, a delayed and scaled signal 526, and a shaped signal 520. Scaled signal 522 may be an example of first scaled signal 322A or second scaled signal 322B, as shown in FIG. 3. Delayed and scaled signal 526 may be an example of first delayed and scaled signal 326A or second delayed and scaled signal 326B. Shaped signal 520 may be an example of first shaped signal 520A or second shaped signal 520B. As shown in FIG. 5, the rising edge of scaled signal 522 suffers from an overshoot. As described above, pulse shaping logic (e.g., combination logic 336 of pulse shaping logic 314 of FIG. 3) combines scaled signal 522 with first delayed and scaled signal 526 to generate adjusted signal 520. As shown in FIG. 5, adjusted signal 520 has a clean step-response as opposed to scaled signal 522.

Figure 6:
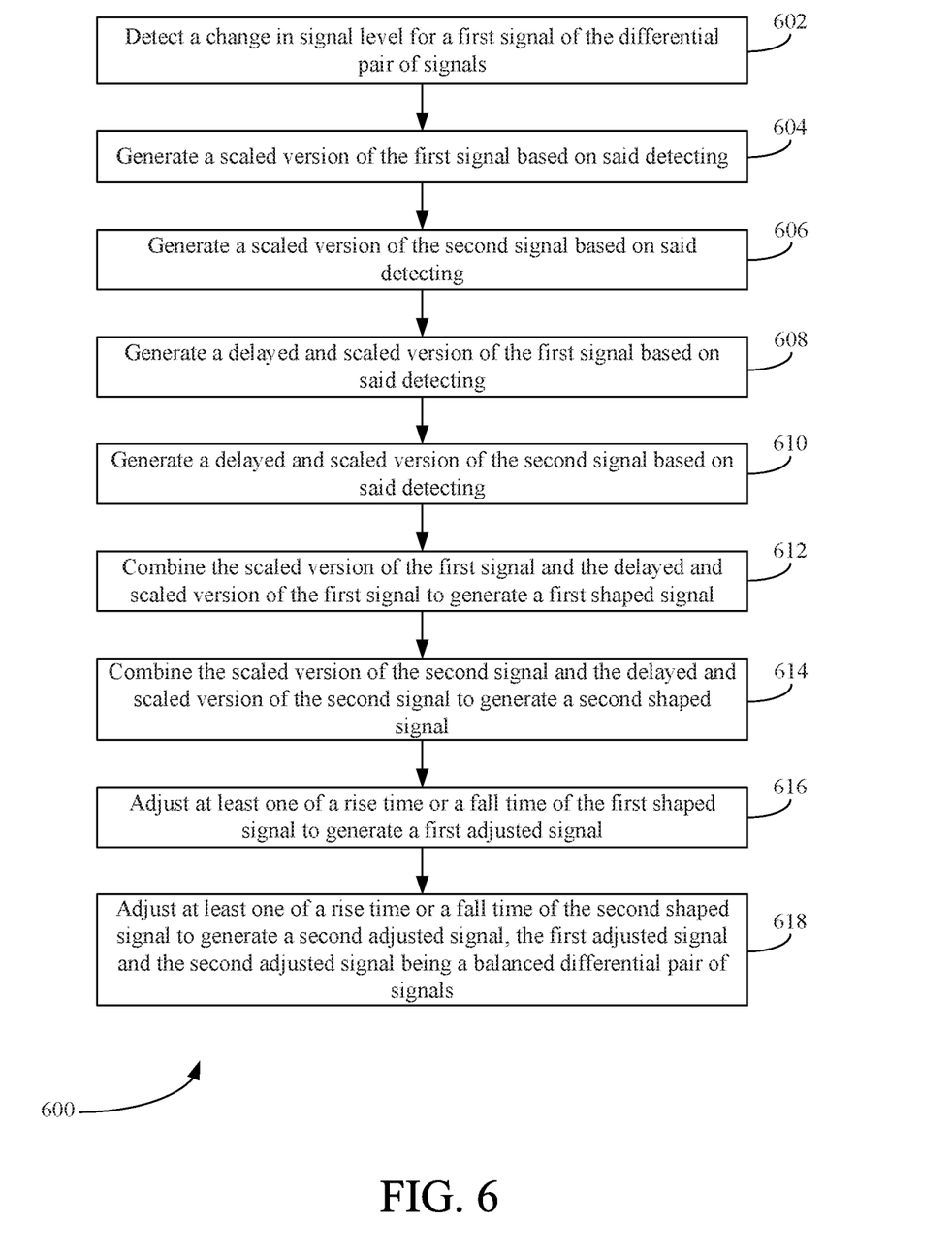
FIG. 6 shows a flowchart providing example steps for a method implemented by a driver circuit for improving the signal integrity for a differential pair of signals in accordance with an embodiment.

Accordingly, in embodiments, a driver circuit may improve the signal integrity for a differential pair of signals in many ways. For example, FIG. 6 shows a flowchart 600 providing example steps for a method implemented by a driver circuit for improving the signal integrity for a differential pair of signals in accordance with an embodiment. Driver circuit 102, as shown in FIG. 1, driver circuit 202, as shown in FIG. 2, and driver circuit 302, as shown in FIG. 3, may each operate according to flowchart 600. The method of flowchart 600 will now be described with continued reference to driver circuit 302 of FIG. 3, although the method is not limited to that implementation. Other structural and operational embodiments will be apparent to persons skilled in the relevant art(s) based on the discussion regarding flowchart 600 and driver circuit 302. Flowchart 600 is described as follows.

As shown in FIG. 6, a change in signal level is detected for a first signal of a differential pair of signals (602). For example, with reference to FIG. 3, signal level detector 310 detects a change in signal level for at least one of first signal 304A or second signal 304B.

Continuing with flowchart 600, a scaled version of the first signal is generated based on the detected change in signal level (604). For example, with reference to FIG. 3, first scaling logic 332 generates a scaled version of first signal 304A (i.e., first scaled signal 322A).

Continuing with flowchart 600, a scaled version of a second signal of the differential pair of signals is generated based on the detected change in signal level (606). For example, with reference to FIG. 3, first scaling logic 332 generates a scaled version of second signal 304B (i.e., second scaled signal 322B).

Continuing with flowchart 600, a delayed and scaled version of the first signal is generated based on the detected change in signal level (608). For example, with reference to FIG. 3, second scaling logic 334 generates a delayed and scaled version of first signal 304A (i.e., first delayed and scaled signal 326A).

In accordance with one or more embodiments, the delayed and scaled version of the first signal is generated based on the detected change in signal level by setting a first predetermined delay and a first predetermined weighted gain used to generate the delayed and scaled version of the first signal. For example, with reference to FIG. 3, calibration logic 312 sets a first predetermined delay and a first predetermined weighted gain based on the change in signal level of at least one of first signal 304A or second signal 304B detected by signal level detector 310. For example, if signal level detector 310 detects that signal level of first signal 304A (or second signal 304B) has changed to '1', signal level detector 310 sets the first predetermined delay and the first predetermined weighted gain to respective first values. If signal level detector 310 detects that signal level of first signal 304A (or second signal 304B) has changed to '0', signal level detector 310 sets the first predetermined delay and the first predetermined weighted gain to respective second values.

Continuing with flowchart 600, a delayed and scaled version of the second signal is generated based on the detected change in signal level (610). For example, with reference to FIG. 3, second scaling logic 334 generates a delayed and scaled version of second signal 304B (i.e., second delayed and scaled signal 326B).

In accordance with one or more embodiments, the delayed and scaled version of the second signal is generated based on the detected change in signal level by setting a second predetermined delay and a second predetermined weighted gain used to generate the delayed and scaled version of the first signal. For example, with reference to FIG. 3, calibration logic 312 sets a second predetermined delay and a second predetermined weighted gain based on the change in signal level of at least one of second signal 304A or second signal 304B detected by signal level detector 310. For example, if signal level detector 310 detects that signal level of first signal 304A (or second signal 304B) has changed to '1', signal level detector 310 sets the second predetermined delay and the second predetermined weighted gain to respective first values. If signal level detector 310 detects that signal level of first signal 304A (or second signal 304B) has changed to '0', signal level detector 310 sets the second predetermined delay and the second predetermined weighted gain to respective second values.

In accordance with one or more embodiments, the first predetermined weighted gain is different than the second predetermined weighted gain and/or the first predetermine delay is different than the second predetermined delay.

Continuing with flowchart 600, the scaled version of the first signal and the delayed and scaled version of the first signal are combined to generate a first shaped signal (612). For example, with reference to FIG. 3, combination logic 336 combines the scaled version of the first signal (i.e., first scaled signal 322A) and the delayed and scaled version of the first signal (i.e., first delayed and scaled signal 326A) to generate first shaped signal 320A.

Continuing with flowchart 600, the scaled version of the second signal and the delayed and scaled version of the second signal are combined to generate a second shaped signal (614). For example, with reference to FIG. 3, combination logic 336 combines the scaled version of the second signal (i.e., second scaled signal 322B) and the delayed and scaled version of the second signal (i.e., second delayed and scaled signal 326B) to generate second shaped signal 320B.

Continuing with flowchart 600, at least one of a rise time or a fall time of the first shaped signal is adjusted to generate a first adjusted signal (616). For example, with reference to FIG. 3, first RC filter 338 adjusts at least one of a rise time or a fall time of first shaped signal 320A to generate first adjusted signal 306A.

In accordance with one or more embodiments, the adjusting of at least one of the rise time or the fall time of the first shaped signal is implemented by a first RC filter comprising at least one first capacitor and at least one first resistor. For example, with reference to FIG. 3, first RC filter 338 comprises at least one first capacitor and at least one first resistor In accordance with one or more embodiments, the first RC filter adjusts at least one of the rise time or the fall time of the first shaped signal by setting at least one of a first predetermined resistance value for the at least one first resistor and a first predetermined capacitance value for the at least one first capacitor in response to the detecting step of step 602 of FIG. 6. For example, with reference to FIG. 3, calibration logic 312 sets at least one of a first predetermined resistance value for the at least one resistor of first RC filter 338 and a first predetermined capacitance value for the at least one first capacitor of first RC filter 338 based on the change in signal level of at least one of first signal 304A or second signal 304B detected by signal level detector 310. For example, if signal level detector 310 detects that signal level of first signal 304A (or second signal 304B) has changed to '1', signal level detector 310 sets at least one of the first predetermined resistance value and the first predetermined capacitance value to respective first values. If signal level detector 310 detects that signal level of first signal 304A (or second signal 304B) has changed to '0', signal level detector 310 sets at least one of the first predetermined resistance value and the first predetermined capacitance value to respective second values.

Continuing with flowchart 600, at least one of a rise time or a fall time of the second shaped signal is adjusted to generate a second adjusted signal, the first adjusted signal and the second adjusted signal being a balanced differential pair of signals (618). For example, with reference to FIG. 3, second RC filter 340 adjusts at least one of a rise time or a fall time of second shaped signal 320B to generate second adjusted signal 306B.

In accordance with one or more embodiments, the adjusting of at least one of the rise time or the fall time of the second shaped signal is implemented by a second RC filter comprising at least one second capacitor and at least one second resistor. For example, with reference to FIG. 3, second RC filter 340 comprises at least one second capacitor and at least one second resistor.

In accordance with one or more embodiments, the second RC filter adjusts at least one of the rise time or the fall time of the second shaped signal by setting at least one of a second predetermined resistance value for the at least one second resistor and a second predetermined capacitance value for the at second one first capacitor in response to the detecting step of step 602 of FIG. 6. For example, with reference to FIG. 3, calibration logic 312 sets at least one of a second predetermined resistance value for the at least one resistor of second RC filter 340 and a second predetermined capacitance value for the at least one second capacitor of second RC filter 340 based on the change in signal level of at least one of first signal 304A or second signal 304B detected by signal level detector 310. For example, if signal level detector 310 detects that the signal level of first signal 304A (or second signal 304B) has changed to '1', signal level detector 310 sets at least one of the second predetermined resistance value and the second predetermined capacitance value to respective first values. If signal level detector 310 detects that the signal level of first signal 304A (or second signal 304B) has changed to '0', signal level detector 310 sets at least one of the second predetermined resistance value and the second predetermined capacitance value to respective second values.

In accordance with one or more embodiments, the driver circuit is a direct modulated laser driver circuit or a SERDES driver circuit.

Figure 7:
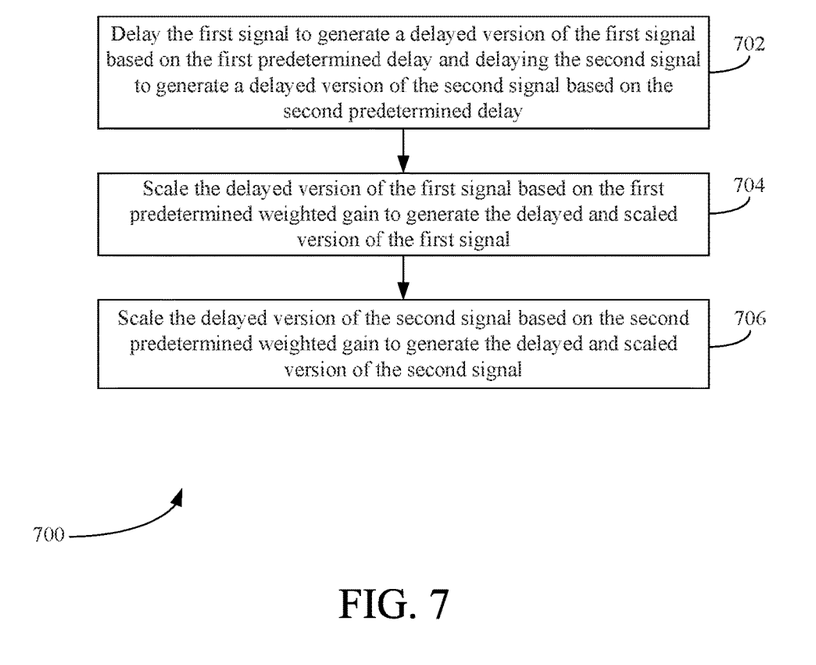
FIG. 7 shows a flowchart of a method for generating a delayed and scaled version of a first signal and a delayed and scaled version of a second signal based on a first predetermined delay, a second predetermined delay, a first predetermined weighted gain, and a second predetermined weighted gain in accordance with an embodiment.

In accordance with one or more embodiments, the delayed and scaled version of the first signal generated in step 608 of FIG. 6 and the delayed and scaled version of the second signal generated in step 610 of FIG. 6 may be generated based on the first predetermined delay, the second predetermined delay, the first predetermined weighted gain, and the second predetermined weighted gain. Accordingly, FIG. 7 shows a flowchart 700 of a method for generating the delayed and scaled version of the first signal and the delayed and scaled version of the second signal based on the first predetermined delay, the second predetermined delay, the first predetermined weighted gain, and the second predetermined weighted gain in accordance with an embodiment. Driver circuit 102, as shown in FIG. 1, driver circuit 202, as shown in FIG. 2, and driver circuit 302, as shown in FIG. 3, may each operate according to flowchart 700. The method of flowchart 700 will now be described with continued reference to driver circuit 302 of FIG. 3, although the method is not limited to that implementation. Other structural and operational embodiments will be apparent to persons skilled in the relevant art(s) based on the discussion regarding flowchart 700 and driver circuit 302. Flowchart 700 is described as follows.

As shown in FIG. 7, the first signal is delayed to generate a delayed version of the first signal based on the first predetermined delay and the second signal is delayed to generate a delayed version of the second signal based on the second predetermined delay (702). For example, with reference to FIG. 3, delay logic 330 generates a delayed version of first signal 304A (i.e., first delayed signal 324A) based on the predetermined delay set by calibration logic 312 and generates a delayed version of second signal 304B (i.e., second delayed signal 324B) based on the second predetermined delay set by calibration logic 312.

Continuing with flowchart 700, the delayed version of the first signal is scaled based on the first predetermined weighted gain to generate the delayed and scaled version of the first signal (704). For example, with reference to FIG. 3, second scaling logic 334 scales the delayed version of first signal 304A (i.e., first delayed signal 324A) based on the first predetermined weighted gain set by calibration logic 312 to generate the delayed and scaled version of first signal 304A (i.e., first delayed and scaled signal 326A).

Continuing with flowchart 700, the delayed version of the second signal is scaled based on the second predetermined weighted gain to generate the delayed and scaled version of the second signal (706). For example, with reference to FIG. 3, second scaling logic 334 scales the delayed version of second signal 304B (i.e., second delayed signal 324B) based on the second predetermined weighted gain set by calibration logic 312 to generate the delayed and scaled version of second signal 304B (i.e., second delayed and scaled signal 326B).

Example Processor Implementation

Driver circuit embodiments described herein, such as driver circuit 102, driver circuit 202 and/or driver circuit 302, along with any respective components/subcomponents thereof, and/or any flowcharts, further systems, sub-systems, components, and/or embodiments disclosed herein may be implemented in hardware (e.g., hardware logic/electrical circuitry), or any combination of hardware with one or both of software (computer program code or instructions configured to be executed in one or more processors or processing devices) and firmware. In embodiments with respect to the example computer implementations in this Section, main memory, memory cards and memory sticks, memory devices, and/or the like may include and or implement the described techniques and embodiments.

Figure 8:
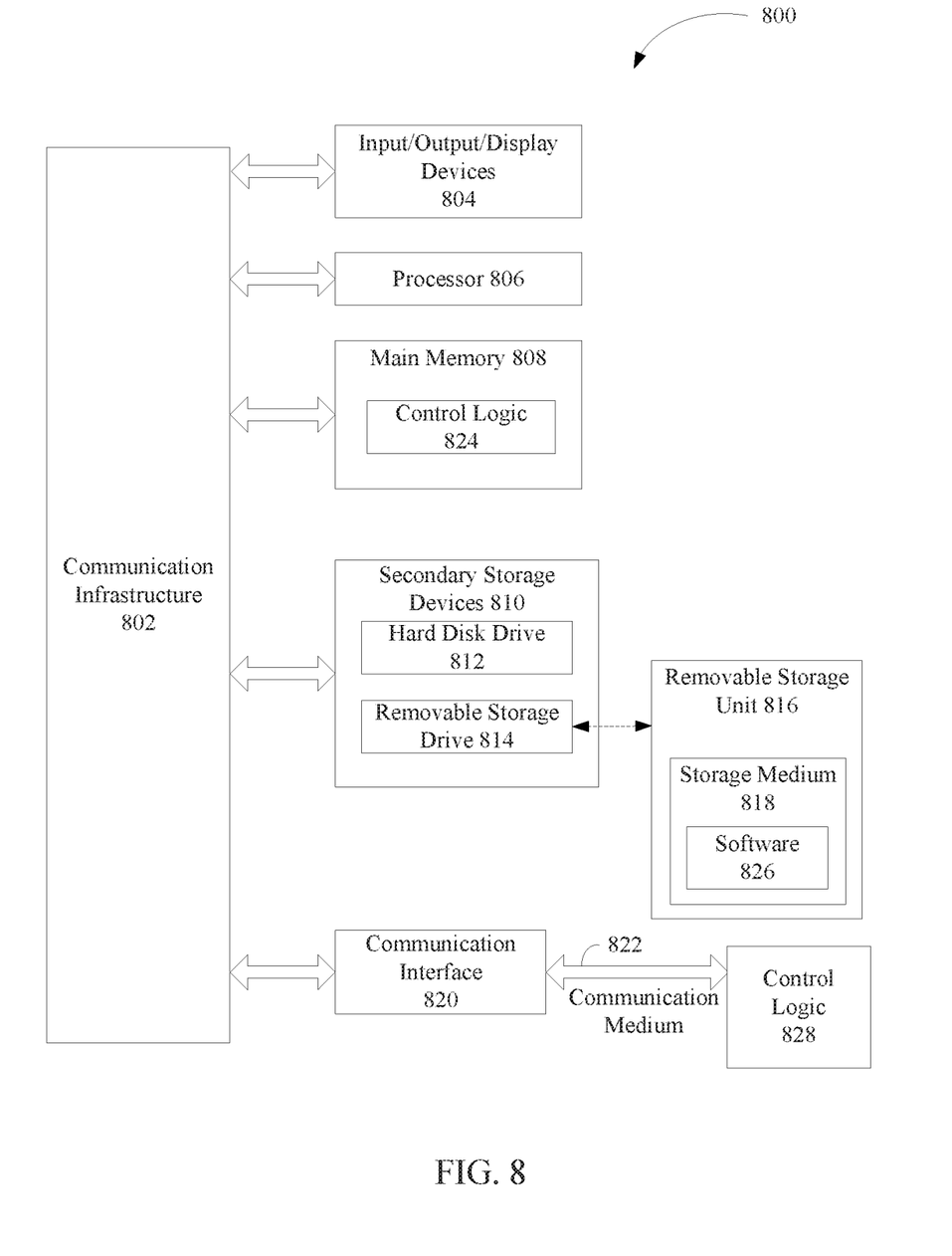
FIG. 8 shows a block diagram of a processing device/system in which the techniques disclosed herein may be performed and the embodiments herein may be utilized.

The embodiments described herein, including circuitry, devices, systems, methods/processes, and/or apparatuses, may be implemented in or using well known processing devices, communication systems, servers, and/or, computers, such as a processing device 800 shown in FIG. 8. It should be noted that processing device 800 may represent mobile devices, communication devices/systems, entertainment systems/devices, processing devices, and/or traditional computers in one or more embodiments. For example, a transceiver as described herein, and any of the sub-systems and/or components respectively contained therein and/or associated therewith, may be implemented in or using one or more processing devices 800 and/or similar computing devices.

Processing device 800 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 800 may be any type of computer, including a desktop computer, a server, etc., and may be a computing device or system within another device or system.

Processing device 800 includes one or more processors (also called central processing units, or CPUs), such as a processor 806. Processor 806 is connected to a communication infrastructure 802, such as a communication bus. In some embodiments, processor 806 can simultaneously operate multiple computing threads, and in some embodiments, processor 806 may comprise one or more processors.

Processing device 800 also includes a primary or main memory 808, such as random access memory (RAM). Main memory 808 has stored therein control logic 824 (computer software), and data.

Processing device 800 also includes one or more secondary storage devices 810. Secondary storage devices 810 include, for example, a hard disk drive 812 and/or a removable storage device or drive 814, as well as other types of storage devices, such as memory cards and memory sticks. For instance, processing device 800 may include an industry standard interface, such a universal serial bus (USB) interface for interfacing with devices such as a memory stick. Removable storage drive 814 represents a floppy disk drive, a magnetic tape drive, a compact disk drive, an optical storage device, tape backup, etc.

Removable storage drive 814 interacts with a removable storage unit 816. Removable storage unit 816 includes a computer useable or readable storage medium 818 having stored therein computer software 826 (control logic) and/or data. Removable storage unit 816 represents a floppy disk, magnetic tape, compact disk, DVD, optical storage disk, or any other computer data storage device. Removable storage drive 814 reads from and/or writes to removable storage unit 816 in a well-known manner.

Processing device 800 also includes input/output/display devices 804, such as touchscreens, LED and LCD displays, monitors, keyboards, pointing devices, etc.

Processing device 800 further includes a communication or network interface 820. Communication interface 820 enables processing device 800 to communicate with remote devices. For example, communication interface 820 allows processing device 800 to communicate over communication networks or mediums 822 (representing a form of a computer useable or readable medium), such as LANs, WANs, the Internet, etc. Network interface 820 may interface with remote sites or networks via wired or wireless connections.

Control logic 828 may be transmitted to and from processing device 800 via the communication medium 822.

Any apparatus or manufacture comprising a computer useable or readable medium having control logic (software) stored therein is referred to herein as a computer program product or program storage device. This includes, but is not limited to, processing device 800, main memory 808, secondary storage devices 810, and removable storage unit 816. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of circuits, devices, apparatuses, and systems. For instance, embodiments may be included, without limitation, in processing devices (e.g., illustrated in FIG. 8) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. § 101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 806 of FIG. 8), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

CONCLUSION

It is noted that while the foregoing embodiments describe techniques for improving the signal integrity of a differential pair of signals that are implemented by driver circuit of a transmitter, the techniques described herein may be extended to a receiver. For example, the techniques described herein may be implemented by a pre-slicer section of a receiver (e.g., a continuous time linear equalizer (CTLE) of a SERDES receiver), as would be understood by one of skill in the relevant art(s) having the benefit of this disclosure.

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A driver circuit for improving signal integrity for a differential pair of signals having a first signal and a second signal, the driver circuit comprising:
    a signal level detector configured to detect a change in signal level of the first signal or the second signal;
    pulse shaping logic configured to:
        generate a delayed and scaled version of the first signal based on the detected change in signal level; and
        combine the first signal and the delayed and scaled version of the first signal to generate a first shaped signal; and
    an edge-rate control filter configured to adjust at least one of a rise time or a fall time of the first shaped signal to generate a first adjusted signal, wherein the first adjusted signal provides a portion of a balanced differential pair of signals.

2. The driver circuit of claim 1, further comprising:
    calibration logic configured to:
        set a first predetermined delay and a first predetermined weighted gain for the pulse shaping logic to use during generation of the delayed and scaled version of the first signal responsive to the detected change in signal level.

3. The driver circuit of claim 2, wherein the pulse shaping logic comprises:
    delay logic configured to generate a delayed version of the first signal based on the first predetermined delay; and
    scaling logic configured to:
        scale the delayed version of the first signal based on the first predetermined weighted gain to generate the first delayed and scaled version of the first signal.

4. The driver circuit of claim 2, wherein the first predetermined weighted gain is different than a second predetermined weighted gain that is used to scale a delayed version of the second signal.

5. The driver circuit of claim 2, wherein the edge-rate control filter comprises a first resistor-capacitor (RC) filter comprising at least one first capacitor and at least one first resistor.

6. The driver circuit of claim 5, wherein the calibration logic is further configured to:
    set at least one of a first predetermined resistance value for the at least one first resistor and a first predetermined capacitance value for the at least one first capacitor responsive to the detected change in signal level.

7. The driver circuit of claim 1, wherein the driver circuit is at least one of:
    a direct modulated laser driver circuit; or
    a serializer/deserializer (SERDES) driver circuit.

8. The driver circuit of claim 1, wherein the pulse shaping logic is further configured to:
    generate a delayed and scaled version of the second signal based on the detected change in signal level; and
    combine the second signal and the delayed and scaled version of the second signal to generate a second shaped signal, wherein a version of the second adjusted signal provides an other portion of the balanced differential pair of signals.

9. A method implemented by a driver circuit for improving signal integrity for a differential pair of signals having a first signal and a second signal, the method comprising:
    detecting a change in signal level of the first signal or the second signal;
    generating a scaled version of the first signal based on said detecting;
    generating a delayed and scaled version of the first signal based on said detecting;
    combining the scaled version of the first signal and the delayed and scaled version of the first signal to generate a first shaped signal; and
    adjusting at least one of a rise time or a fall time of the first shaped signal to generate a first adjusted signal, the first adjusted signal being a portion of a balanced differential pair of signals.

10. The method of claim 9, wherein generating the delayed and scaled version of the first signal based on the detected change in signal level comprises:
    setting a first predetermined delay and a first predetermined weighted gain used to generate the delayed and scaled version of the first signal based on said detecting.

11. The method of claim 10, further comprising:
    delaying the first signal to generate a delayed version of the first signal based on the first predetermined delay; and
    scaling the delayed version of the first signal based on the first predetermined weighted gain to generate the delayed and scaled version of the first signal.

12. The method of claim 10, wherein the first predetermined weighted gain is different than a second predetermined weighted gain that is used to scale a delayed version of the second signal.

13. The method of claim 9, wherein said adjusting the at least one of the rise time or the fall time of the first shaped signal is implemented by a first resistor-capacitor (RC) filter comprising at least one first capacitor and at least one first resistor.

14. The method of claim 13, wherein said adjusting the at least one of the rise time or the fall time of the first shaped signal comprises:
    setting at least one of a first predetermined resistance value for the at least one first resistor and a first predetermined capacitance value for the at least one first capacitor in response to said detecting.

15. The method of claim 9, wherein the driver circuit is one of:
    a direct modulated laser driver circuit; or
    a serializer/deserializer (SERDES) driver circuit.

16. The method of claim 9, further comprising:
    generating a scaled version of the second signal based on said detecting;
    generating a delayed and scaled version of the second signal based on said detecting; and
    combining the scaled version of the second signal and the delayed and scaled version of the second signal to generate a second shaped signal, wherein a version of the second adjusted signal provides another portion of the balanced differential pair of signals.

17. A driver circuit for improving signal integrity for a differential pair of signals having a first signal and a second signal, the driver circuit comprising:
   a signal level detector configured to detect a change in signal level of the first signal or the second signal;
   pulse shaping logic configured to:
      generate a scaled version of the first signal based on the detected change in signal level;
      generate a delayed and scaled version of the first signal based on the detected change in signal level; and
      combine the scaled version of the first signal and the delayed and scaled version of the first signal to generate a first shaped signal; and
   an edge-rate control filter configured to adjust at least one of a rise time or a fall time of the first shaped signal to generate a first adjusted signal, wherein the first adjusted signal provides a portion of a balanced differential pair of signals.

18. The driver circuit of claim 17, further comprising:
   calibration logic configured to:
      set a first predetermined delay and a first predetermined weighted gain for the pulse shaping logic to use during generation of the delayed and scaled version of the first signal responsive to the detected change in signal level.

19. The driver circuit of claim 18, wherein the pulse shaping logic comprises:
   delay logic configured to generate a delayed version of the first signal based on the first predetermined delay; and
   scaling logic configured to scale the delayed version of the first signal based on the first predetermined weighted gain to generate the first delayed and scaled version of the first signal.

20. The driver circuit of claim 18, wherein the first predetermined weighted gain is different than a second predetermined weighted gain that is used to scale a delayed version of the second signal.

* * * * *